United States Patent [19]

Kumbatovic

[11] 3,978,349

[45] Aug. 31, 1976

[54] SWITCHING CIRCUIT

[75] Inventor: Robert Anthony Kumbatovic, Cliffwood Beach, N.J.

[73] Assignee: RCA Corporation, New York, N.Y.

[22] Filed: Sept. 3, 1974

[21] Appl. No.: 502,672

[52] U.S. Cl. ............................. 307/255; 307/246; 307/254; 307/300
[51] Int. Cl.² ........................................ H03K 17/00
[58] Field of Search .......... 307/300, 255, 254, 229, 307/230, 246

[56] References Cited
UNITED STATES PATENTS

| | | | |
|---|---|---|---|
| 3,050,673 | 8/1972 | Widmer | 307/255 |
| 3,160,767 | 12/1964 | Tindall | 307/255 |
| 3,513,330 | 5/1970 | Bernex | 307/255 |

Primary Examiner—Stanley D. Miller, Jr.
Assistant Examiner—B. P. Davis
Attorney, Agent, or Firm—H. Christoffersen; Henry I. Schanzer

[57] ABSTRACT

The circuit includes a first switching device having an input and an output and which in response to the presence of a signal at its input produces an out-of-phase signal at its output. A capacitor is connected, at one end, to the output of the first device. A second, normally open, switching device is connected between the other end of the capacitor and the input of the first device. When the first device is turned on, the signal at its output is coupled from one end to the other end of the capacitor and the capacitor functions to level shift and store the signal at its other end. The stored signal exceeds the range of the operating potential applied to the circuit and may be used to turn off the first switching device when the, normally open, second switching device is closed.

18 Claims, 6 Drawing Figures

SWITCHING CIRCUIT

This invention relates to switching circuits and in particular to switching circuits for generating potentials outside the range of the power supply connected to the circuit.

There are numerous applications in which it is necessary and/or desirable to increase the available power supply potential as when the available potential of the power supply is too low or becomes too low. There are also many applications in which it is necessary and/or desirable to generate bias potentials outside the range of the available power supply. For example, a high power transistor once driven into saturation remains conducting for a relatively long period of time after the removal of the drive signal. This is due to a large amount of charge stored in the collector-to-base junction of the transistor. The transistor is slow to turn off and the power dissipation across the transistor during the turn off period is high. The high power dissipation causes the transistor to heat up, increasing its leakage current and further slowing down the turn off of the transistor. To speed up the turn off of the transistor, a reverse bias may be applied to the base of the transistor to sweep out or remove the stored charge.

One way of generating a reverse bias is to have the power supply providing the operating potential (e.g. $+V_{DD}$ and ground) also include a source of potential outside the range of the operating potential (i.e., a potential which is either more negative than the lowest applied operating potential or more positive than the highest applied operating potential). Another way is to have an external source of energy, other than the source of operating potential, provide the reverse bias. These power supply systems are external to the transistor circuit to be controlled and generally require many extra components and consume considerable amounts of power. Furthermore, such power supply systems are often not available.

It is desirable to be able to generate potentials outside the range of the available power supply using few components and consuming little extra power. It is even more desirable to have the transistor circuit include means for generating its own reverse bias.

Circuits embodying the invention include a first means having an input and an output and which in response to the presence of an input signal produces an out-of-phase signal at its output. A second menas, connected to said output, functions to store the out-of-phase signal. A third means connected between the second means and the input to said first means applies the stored out-of-phase signal to the input of the first means upon the termination of the input signal.

In the accompanying drawings like reference characters denote like components; and FIG. 1 is a schematic diagram of a circuit embodying the invention using bipolar transistors of different conductivity type;

Figure 1:
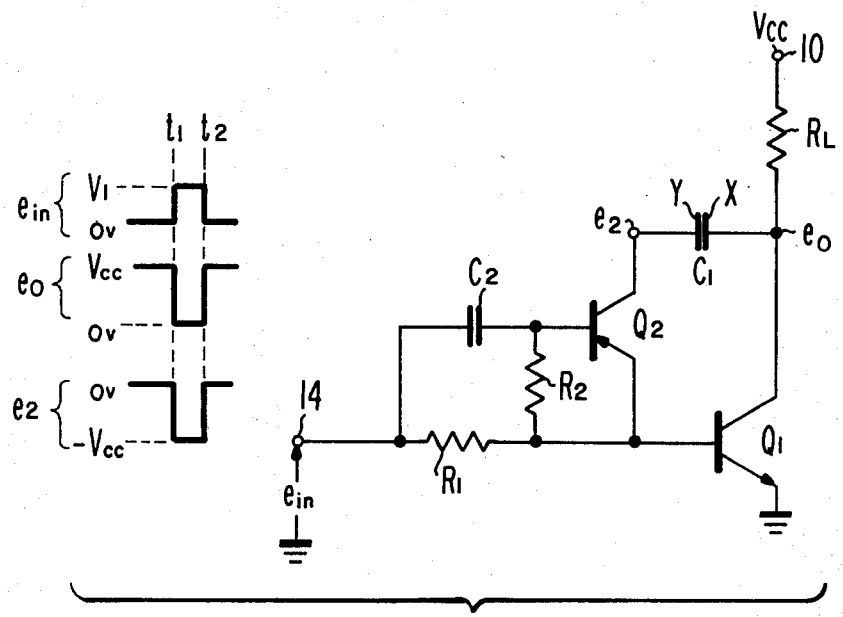

The circuit of FIG. 1 includes NPN transistor Q1 connected at its emitter to ground potential and at its collector to the one terminal, labelled X, of capacitor C1 and to one end of load resistor $R_L$. The other end of resistor $R_L$ is connected to terminal 10 to which is applied a potential, denoted Vcc, which is positive with respect to ground. A PNP transistor Q2 is connected at its collector to the other terminal, labelled Y, of capacitor C1 and at its emitter to the base of transistor Q1. Resistor R1 is connected between input terminal 14 and the base of transistor Q1. Capacitor C2 is connected between input terminal 14 and the base of transistor Q2, and resistor R2 is connected between the base and emitter of transistor Q2.

For ease of reference, the potentials at the collectors of transistors Q1 and Q2 will be denoted $e_o$ and $e_2$, respectively, and the input signal applied to terminal 14 will be denoted $e_{in}$.

Assume that the potential $e_{in}$ is normally at or near ground potential. For this input signal condition, transistor Q1 is cut off and the potential $e_o$ at its collector and at terminal X of capacitor C1 is at $+Vcc$ volts. Transistor Q2 is also cut off and the potential $e_2$ at terminal Y of capacitor C1 is initially at or near ground potential by conduction through the collector-to-base junction of transistor Q2 and resistors R2 and R1 to terminal 14.

Assume as shown in FIG. 1 that, at time $t_1$, $e_{in}$ goes positive from zero volts to $+V_1$ volts. The positive going pulse induces a current to flow through resistor R1 and into the base of transistor Q1. The amplitude $V_1$ of the pulse and the value of resistor R1 are selected to ensure that sufficient base drive is supplied to transistor Q1 to drive it into saturation, whereby the potential $e_o$ at its collector makes a transition from $+V_{cc}$ volts to approximately zero volts. The lowest value of the the signal at the collector of transistor Q1 will actually be equal to the saturation voltage, $V_{CE\ SAT}$, of the transistor and ranges from 0.3 volts to about 1 volt. However, for ease of the discussion to follow, it will be assumed that $V_{CE\ SAT}$ is equal to zero volts.

Concurrently with turning on transistor Q1, the positive going transition of the input pulse is coupled through capacitor C2 to the base of transistor Q2 and applies a reverse bias between the base and emitter of transistor Q2, which maintains transitor Q2 in the cut-off condition.

Recall that at time $t_1$, $e_{in}$ went positive and $e_o$ and the potential at terminal X of capacitor C1 went from $V_{cc}$ volts to zero volts. The negative going voltage step applied to terminal X passes through capacitor C1 since the potential across a capacitor cannot change instantaneously. Since just prior to time $t_1$, the potential at terminal Y of capacitor C1 was at, or close to, zero volts, the potential at terminal Y goes from zero volts to $-V_{cc}$ volts. Thus, whereas the potential $e_o$ at the collector of transistor Q1 goes from $+V_{cc}$ volts to zero volts, the potential $e_2$ at terminal Y goes from zero volts to $-V_{cc}$ volts. Where, for example, $V_{cc}$ is 100 volts, a potential of approximately $-100$ volts is generated at terminal Y. The negative potential ($-V_{cc}$ volts) at terminal Y may be maintained for a long time, for when transistor Q2 is cut off, its collector-to-emitter impedance is very high and it behaves as an open switch.

It should be appreciated that with $V_{cc}$ volts available at terminal 10 and $-V_{cc}$ volts available at terminal Y, a potential of $2V_{cc}$ volts is available between terminals 10 and Y. The circuit thus functions to double the available ($V_{cc}$) power supply potential.

When at time $t_2$ the input pulse makes a transition from $+V_1$ volts to zero volts, base drive from the input pulse is no longer supplied to the base of transistor Q1. However, if transistor Q2 and capacitor C1 were not present in the circuit, it might take many microseconds for transistor Q1 to turn off. This is best understood by noting that in the circuit of FIG. 1, for example, $V_{cc}$ may be 100 volts and $R_L$ may be 10 ohms. When transistor Q1 is fully on, approximately 10 amperes of current flow through $R_L$ and transistor Q1. In order to minimize the power dissipation in transistor Q1 and to prevent it from overheating, it is essential that when transistor Q1 is turned on that it be turned on hard, i.e. be fully saturated.

Driving a transistor into saturation at high current levels causes charge to be stored in the collector-to-base region of the transistor. The accumulated collector-to-base charge must be removed before the transistor can be turned off. Where the transistor is carrying large currents, (e.g. 10 amperes) the amount of charge to be removed is relatively high and, as mentioned above, it may take many microseconds to remove the charge and turn off the transistor.

The maximum dissipation in transistor Q1 occurs at the half-way point between full on and full off. For the example above, when transistor Q1 is carrying 5 amperes there is 50 volts across it and the transistor is dissipating 250 watts. Such a high level of dissipation even though it occurs for only a few microseconds may destroy the transistor. The transition time from off to on or from on to off must therefore be minimized.

It will now be shown that when $e_{in}$ returns to zero volts the negative potential present at terminal Y of capacitor C1 quickly turns off transistor Q1.

At time $t_2$ the negative going transition of $e_{in}$ is coupled through capacitor C2 to the base of PNP transistor Q2 causing its base to be forward biased with respect to its emitter. Transistor Q2 is turned on, the impedance of its collector-to-emitter path becomes very low, and it functions effectively as a closed switch. When transistor Q2 turns on, the $-V_{cc}$ volts present at terminal Y of capacitor C1 is coupled to the base of transistor Q1. Capacitor C1 functions as a source of reverse bias potential with a low source impedance. This large negative potential causes a large current to be drawn out of the base of transistor Q1 turning it off quickly. A loop current flows from terminal X through the collector-to-base of transistor Q1 and through the emitter-to-collector path of transistor Q2 into terminal Y of capacitor C1. This current flows until capacitor C1 is discharged. Loop currents having an amplitude of 18 amperes have been measured for $V_{cc}=$ 100 volts, $R_L =$ 10 ohms, and C1 = 10 ufd. Turn off times varying between 25 and 200 nanoseconds ($10^{-9}$ seconds) have been observed compared to turnoff times varying between 0.8 and 5 microseconds ($10^{-6}$ seconds) without the use of Q2 and C1.

As transistor Q1 turns off, the potential at its collector rises quickly from zero volts to $V_{cc}$ volts. The positive going potential at terminal X is coupled through capacitor C1 to terminal Y. But, when the potential at the latter goes slightly positive, the collector-to-base junction of transistor Q2 becomes forward biased and there is conduction through resistors R2 and R1 to ground. The potential at terminal Y thus never rises significantly above zero volts while transistor Q1 is being turned off.

When transistor Q1 is turned on, a signal ($e_o$) out-of-phase with the input signal ($e_{in}$) is produced at its collector. This out-of-phase signal (which if applied to the base of transistor Q1 would provide negative feedback) is level shifted and stored in the capacitor ($e_2$) until transistor Q2 is turned on. When the input signal terminates and it is desired to turn off transistor Q1, the stored negative feedback signal $e_2$ is applied to the base of transistor Q1 by means of the low on impedance of transistor Q2. Thus, when Q1 turns on it causes a reverse bias potential ($-V_{cc}$) to be generated (at terminal Y) which is later fed back to the base of Q1 to turn it off.

It should also be appreciated that the reverse bias potential, generated when Q1 is turned on, is used up when Q1 is turned off. The reverse bias ($-V_{cc}$) thus is generated (at Y) only in anticipation of a future need (i.e. to turn off Q1). When no future need is indicated (i.e. Q1 is off) no reverse bias potential is generated and no unnecessary power is consumed.

Connecting a capacitor such as C1 in the collector circuit of a transistor normally decreases the speed of response of a transistor. As is well known, the collector-to-base capacitance of a transistor is multiplied by the gain of the transistor (i.e. the Miller effect) and the effect of the capacitance is to considerably slow down the turn on or turn off of the transistor. However, as demonstrated above, capacitor C1 functions to decrese the turn off time of transistor Q1 by many orders of magnitude without noticeably increasing its turn on time.

Figure 2:
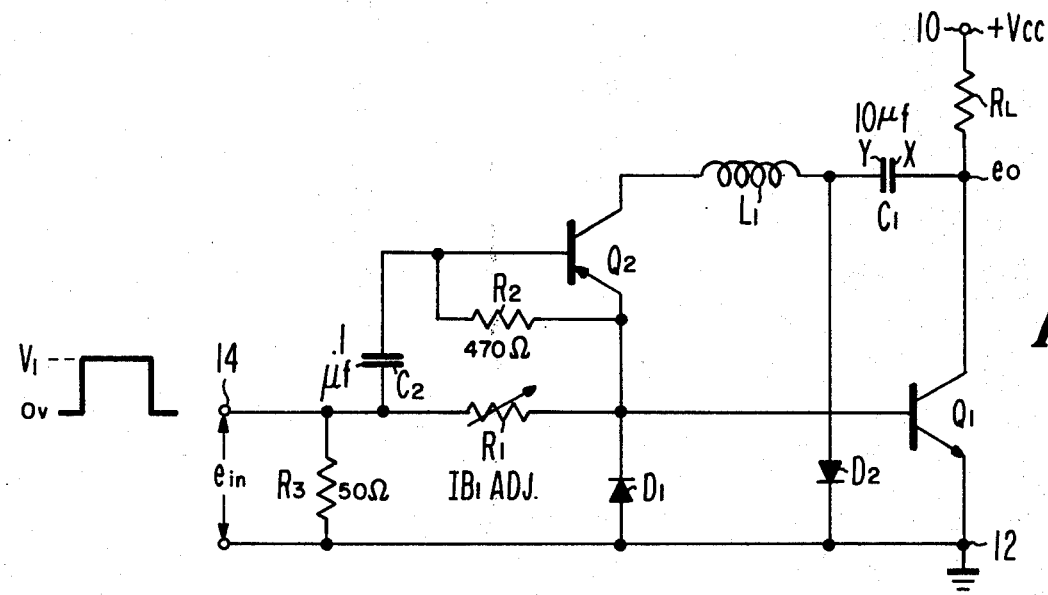
FIG. 2 is the schematic diagram of another circuit embodying the invention.

A problem exists in the circuit of FIG. 1 when transistor Q1 is an extremely slow device. It has then been observed that at the termination of the input pulse, capacitor C1 is discharged through the collector-to-base path of transistor Q1 and functions to momentarily turn off transistor Q1. However, subsequent to the discharge of capacitor C1, transistor Q1 is still partially turned on and it still takes up to 4 or 5 microseconds for transistor Q1 to turn off completely. During the transition period from full on to full off, the power dissipation across the transistor is extremely high. In the circuit of FIG. 2, the power dissipation in transistor Q1 is minimized by minimizing the transition time from on to off of the transistor at the expense of storage time. Storage time may be defined as that period of time starting at the termination of the input pulse (time $t_2$) until the transistor Q1 starts to respond to the termination of the input pulse.

The circuit of FIG. 2 differs from the circuit of FIG. 1 in that an inductor L1 is connected between terminal Y of capacitor C1 and the collector of transistor Q2 and in the addition of diodes D1 and D2. The inductor L1 may be a very small inductor comprised of a few turns of wire. Its value, depending on the application, may vary from one to hundreds of microHenrys. Diode D1 is connected at its cathode to the base of transistor Q1 and at its anode to the emitter of transistor Q1. Diode D2 is connected at its anode to terminal Y of capacitor C1 and at its cathode to the emitter of transistor Q1. Resistor R1 is shown as a variable resistor. This enables the adjustment of the base current level to ensure that sufficient current is supplied to transistor Q1 to saturate the latter. A ground return resistor R3 is connected between terminals 12 and 14.

The operation of the circuit of FIG. 2 in response to a positive going input pulse is similar to that of FIG. 1. When $e_{in}$ goes high transistor Q2 is maintained in the off condition and transistor Q1 is turned on. The negative going voltage step (from $+V_{cc}$ volts to zero volts) at the collector of transistor Q1 is coupled through capacitor C1, producing at terminal Y a level shifted potential of approximately $-V_{cc}$ volts.

At the termination of the input pulse ($e_{in}$ returns to zero volts) transistor Q2 is turned on and no base drive is supplied to transistor Q1 from the input signal source. The discharge loop now includes capacitor C1 in series with inductor L1 in series with the collector-to-emitter path of transistor Q2 and the base-to-collector path of transistor Q1. The inductor L1 delays the application of the negative potential present at terminal Y of capacitor C1 to the base of transistor Q1. But, just as it delays the application of the signal it also prevents the quick dissipation of the charge stored across capacitor C1. Due to inductor L1, the potential coupled to the base of transistor Q1 is a negative going ramp. Following the termination of the input pulse, a period of time, defined as storage time, will elapse before the potential at the base of transistor Q1 is driven to and below $V_{BE}$ volts. Until that occurs, transistor Q1 remains fully on and its power dissipation is relatively low. As soon as the base of Q1 is driven below $V_{BE}$ volts, transistor Q1 is quickly turned off and maintained off since the negative going potential applied to it is maintained due to the action of inductor L1. As a result, the negative potential present at terminal Y is coupled to the base of transistor Q1 for a longer period of time and the full, complete and quick turn off of transistor Q1 is ensured. Diode D1 prevents the base potential of Q1 from going negative by more than one $V_{BE}$ drop below ground. That is, the base voltage of transistor Q1 is clamped to $-V_{BE}$ volts when the potential at the base tries to go more negative. Diode D2 prevents the potential at terminal Y of capacitor C1 from going more positive than one $V_{BE}$ drop above ground when transistor Q1 is being turned off. On the other hand, when transistor Q1 is being turned on, the potential at its collector goes negative and the negative going signal is fed through capacitor C1 to terminal Y. For a negative going signal at Y, diode D2 is reverse biased and has little, if any effect on the negative signal produced at terminal Y. In addition, diodes D1 and D2 function to suppress spikes generated when transistor Q2 is turned on and off.

In the circuit of FIG. 2, as well as that of FIG. 1, the capacitor C2 must be made sufficiently large to ensure that transistor Q2 is on for a period of time, which is sufficiently long to turn off transistor Q1. On the other hand, it is desirable that the value of the capacitor be made as small as possible. Replacing transistor Q2 by a regenerative switch enables capacitor C2 to be made very small since the holding action of the switch is not greatly dependent on the charge stored in capacitor C2 or on the time constant of the input network including capacitor C2.

Figure 3:
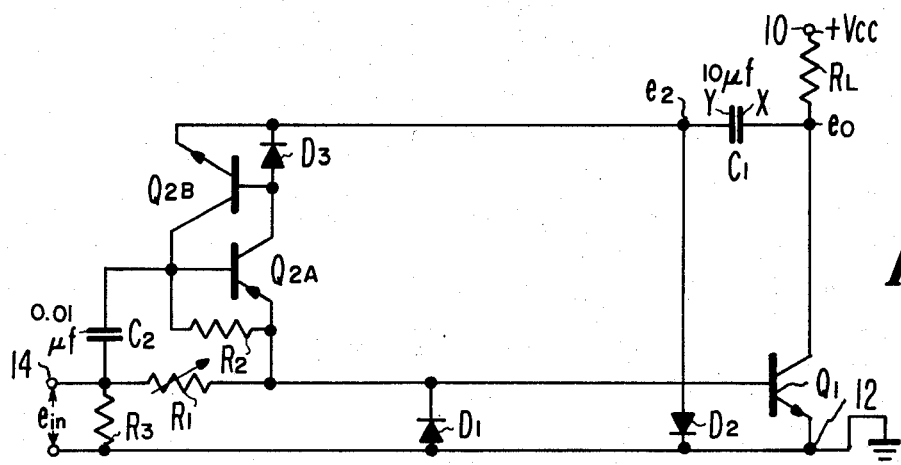
FIG. 3 is the schematic diagram of a circuit embodying the invention using a regenerative switch.

In the circuit of FIG. 3, PNP transistor Q2A and NPN transistor Q2B are connected to form a regenerative switch between terminal Y of capacitor C1 and the base of transistor Q2B. Resistor R2 is connected between the base and emitter of transistor Q2A and diode D3 is connected between the base and emitter of transistor Q2B. Except for the deletion of inductor L1 and the replacement of transistor Q2 with transistors Q2A and Q2B the circuit of FIG. 3 is similar to that of FIG. 2.

In response to $e_{in}$ going from zero volts to $V_1$ volts, transistor Q1 is turned on. When transistor Q1 turns on, the potential $e_o$ at its collector goes from $+V_{cc}$ volts to zero volts and the potential at terminal Y of capacitor C1 goes from approximately zero volts to approximately $-V_{cc}$ volts. Transistor Q2B is not turned on since no current is supplied to its base.

When $e_{in}$ goes from $+V_1$ volts to zero volts, the negative going transition of the input signal is coupled through capacitor C2 and is applied to the base of transistor Q2A. The base-to-emitter region of transistor Q2A is forward biased and transistor Q2A then supplies base drive to transistor Q2B. Transistor Q2B draws its collector current from the base of transistor Q2A which, in turn, supplies more base drive to transistor Q2B. Once conduction is initiated in transistor Q2A, positive feedback between transistors Q2A and Q2B cause the regenerative switch to latch up. Therefore, capacitor C2 may be made very small since it must be only large enough to pass sufficient signal to initiate conduction. It is not needed to sustain conduction. Typically, capacitor C2 in FIG. 3 may be an order of magnitude smaller than the corresponding capacitor in FIG. 1 and 2. When transistors Q2A and Q2B are driven into saturation they function as a low impedance switch and couple the base of transistor Q1 to terminal Y. When transistors Q2A and Q2B are turned on a loop current flows from terminal X through the collector-to-base region of transistor Q1, through the collector-to-emitter paths of transistors Q2A and Q2B to terminal Y. This loop current draws large currents out of the base of transistor Q1, turning it off quickly. A distinct advantage of using a regenerative switch such as transistor Q2A and Q2B is that it becomes nonconducting (i.e., it automatically opens up) when the potential between terminal Y of capacitor C1 and the base of transistor Q1 becomes very small, (i.e., capacitor C1 is discharged.) Therefore, there need be no concern about additional circuitry to keep it off or to turn it off.

Figure 4:
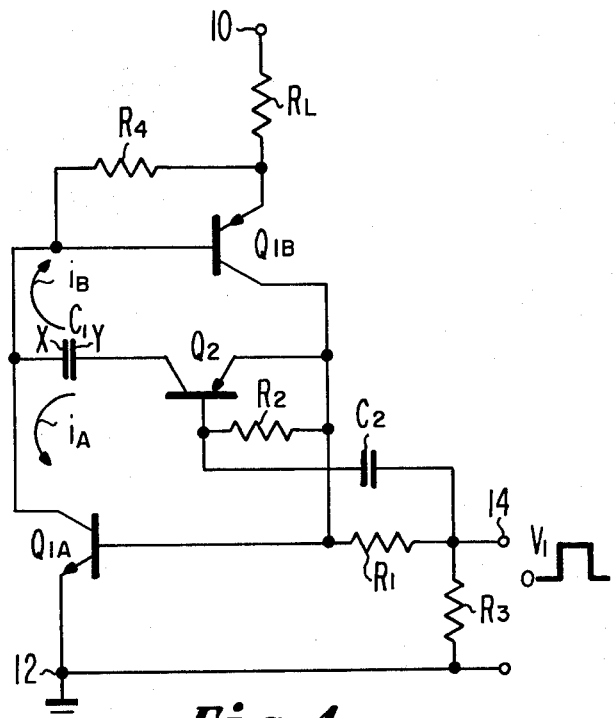
FIG. 4 is the schematic diagram of circuit embodying the invention using a regenerative switch to drive a load.

The load, $R_L$, may be driven by a switching means other than a transistor as shown in FIG. 4. The circuit of FIG. 4 differs from that in FIG. 1 in that transistor Q1 of FIG. 1 is replaced in FIG. 4 by a pair of complementary transistors Q1A and Q1B connected to form a regenerative switch. In addition, an optional resistor R3 is connected between the input terminal 14 and ground, and an optional resistor R4 is connected between the base and emitter of transistor Q1B to desensitize the transistor to noise pulses. With the input signal at zero volts terminal X of capacitor C1 is at, or close to, $+V_{cc}$ volts and transistor Q1B is turned off. The potential at terminal Y of capacitor C1 is at, or close to, zero volts. When the input signal makes a positive going transition from zero volts to $V_1$ volts, transistor Q1A is turned on, drawing current from the base of transistor Q1B. The voltage at terminal X of capacitor C1 falls to, or close to, ground potential. The base current drawn from transistor Q1B causes its collector current to increase and it then supplies additional base current to transistor Q1A. By regenerative action transistors Q1A and Q1B quickly switch fully on and bring the potential of the emitter of transistor Q1B close to zero volts. The negative going step from $+V_{cc}$ to approximately zero volts at terminal X of capacitor C1 is coupled through capacitor C1 and produces at terminal Y a potential that goes approximately from zero volts to $-V_{cc}$ volts. Transistor Q2 is open or off since, as explained above, the positive going input signal maintains transistor Q2 in the reverse bias condition.

It will now be shown that when $e_{in}$ makes a negative going transition from $V_1$ volts to zero volts, transistors Q1B and Q1A are turned off even though they may have been carrying large currents, and they are turned off without the addition of large sources of external reverse bias potentials. When $e_{in}$ goes negative, transistor Q2 is turned on and provides a low impedance conduction path between terminal Y and the collector and base of transistors Q1B and Q1A, respectively.

A loop current $i_A$ flows from terminal X through the collector-to-base region of transistor Q1A and a loop current $i_B$ flows from terminal X through the base-to-collector region of transistor Q1B. The two loop currents then flow through the emitter-to-collector path of transistor Q2 into terminal Y eventually discharging capacitor C1. The effect of loop current $i_A$ is to draw current out of the base of transistor Q1A in a direction to cut off the transistor and the effect of current $i_B$ is to supply current into the base of transistor Q1B in a direction to cut it off. By means of loop currents $i_A$ and $i_B$ transistors Q1A and Q1B are being cut off at the same time and conduction through transistor Q1B and Q1A is quickly ended.

The circuit of FIG. 4 may be modified to maximize turn-on speed and/or sensitivity by connecting a diode in series with capacitor C1. The diode would be connected at its anode to terminal X and at its cathode to the base of transistor Q1B and the collector of transistor Q1A. In addition, a resistor would be connected between terminal X and terminal 10.

Figure 5:
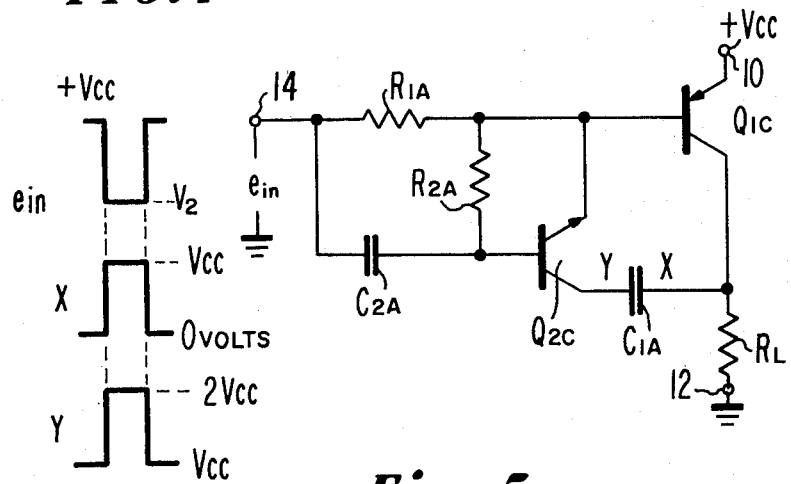
FIGS. 5 and 6 are schematic diagrams of still other circuits embodying the invention.

The circuit of FIG. 5 is similar to the circuit of FIG. 1 except that the transistors used in this circuit are of complementary conductivity type to the ones shown in FIG. 1. The operation of the circuit of FIG. 5 is complementary to that of FIG. 1. The potential produced at terminal Y of capacitor C1A being more positive (2Vcc) than the most positive operating potential (+$V_{cc}$) applied to terminal 10 of the circuit.

Figure 6:
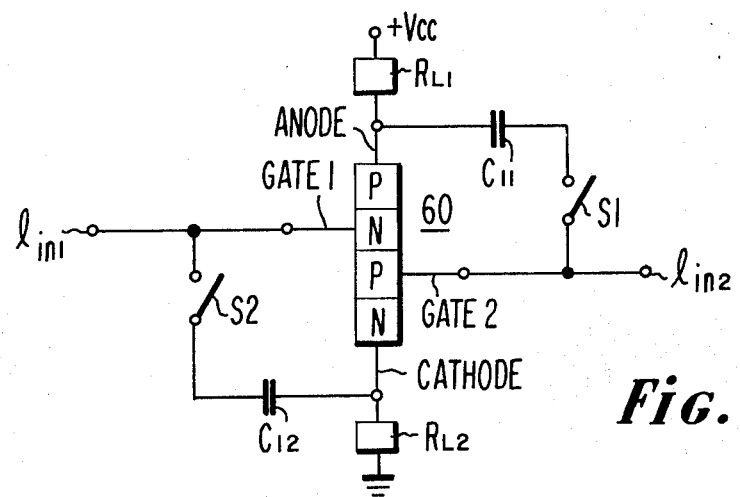

The regenerative switch Q1A and Q1B of FIG. 4 may be replaced by any four (4) layered device which can be turned off by the application of a reverse bias pulse to its gate or gates. FIG. 6 shows PNPN device 60 connected at its anode through a first load, $R_{L1}$, to +$V_{cc}$ volts and connected at its cathode through a second load, $R_{L2}$, to ground potential. First and second input signals $e_{in1}$ and $e_{in2}$ may be applied to gates 1 and 2, respectively. The input signal applied to gate 1 would be of the type shown for $e_{in}$ in FIG. 5 and the input signal applied to gate 2 would be of the type shown for $e_{in}$ in FIGS. 1 through 4. Where the two gates of the 4-layer device are available (i.e. gates 1 and 2) only a single turn off circuit connected between the gates is needed to turn off the 4-layer device. The combination of a capacitor C2 and a transistor (Q2) as shown in FIG. 4, could be connected between the two gates.

However, as shown in FIG. 6, two turn off circuits may be used. A first turn off circuit includes capacitor C11 and selectively enabled switch S1 connected in series between the anode and gate 2 of device 60. A second turn off circuit includes capacitor C12 and selectively enabled switch S2 connected in series between the cathode and gate 1 of device 60. Switch S1 may be similar to transistor Q2 of FIGS. 1, 2 and 4 or regenerative switch Q2A, Q2B of FIG. 3. Switch S2 may be similar to transistor Q2C of FIG. 5. Where only one gate of the 4-layer device is available as in some silicon controlled rectifiers (SCR's) and gate-turn-off-thyristors (GTO's) the 4-layer device may be operated with one turn-off circuit and the operation would then be similar to that discussed above for FIGS. 1 through 3 or 5.

The switching means (e.g. transistors Q1 and Q2) may be bipolar transistors or any other form of switching means having a conduction path and a control electrode. Thus, field effect transistors could also be used instead of the bipolar transistors or the regenerative switches shown in the embodiments.

What is claimed is:

1. The combination comprising:
   first means having an input and an output, said first means being responsive to an input signal for producing an out-of-phase signal at its output;
   second means connected to said output for sensing, level shifting, and storing the out-of-phase signal; and
   third means connected between said second means and the input to said first means for coupling the stored, level shifted, out-of-phase signal to said input upon the termination of said input signal for turning off said first means rapidly.

2. The combination as claimed in claim 1, wherein each one of said first and third means includes a switching means having a conduction path and a control electrode;
   wherein said second means has an input and an output;
   wherein the conduction path of the switching means of said third means is connected between the output of said second means and the control electrode of the switching means of said first means; and
   wherein the conduction path of the switching means of said first means is connected at one end ot the input of said second means.

3. The combination as claimed in claim 2, wherein said second means is a capacitor and wherein each one of said switching means is a transistor.

4. The combination as claimed in claim 2, wherein one of said first and third switching means is a regenerative switch and wherein said means is a capacitor.

5. The combination as claimed in claim 1, wherein said second means includes an input terminal connected to said output of said first means and an output terminal connected to said third means; wherein said second means couples to, and stores at, its output terminal the signals applied to its input terminal, and wherein the signals produced at its output have approximately the same amplitude but a different direct current level than the signal applied to its input terminal.

6. The combination as claimed in claim 1 wherein said first means is comprised solely of a single transistor having a base, an emitter and a collector;
   wherein said second means is a capacitor connected at one end to said collector; and
   wherein said third means includes a switching transistor connected between the other end of said capacitor and the base of said single transistor.

7. The combination comprising:
   first and second switching means, each switching means having a conduction path and a control electrode for controlling the conductivity of its conduction path;

means for connecting a load to one end of the conduction path of said first switching means;

a capacitor;

means connecting one end of said capacitor to said one end of the conduction path of the first switching means;

means connecting the conduction path of said second switching means between the other end of said capacitor and the control electrode of said first switching means;

an input terminal for the application thereto of an input signal; and means connected between said input terminal and the control electrodes of said first and second switching means responsive to the presence of an input signal for turning on said first switching means and maintaining said second switching means in the off condition and responsive to the termination of said input signal for turning on said second switching means and coupling said other end of said capacitor to said control electrode of said first switching means through a low impedance connection for rapidly turning off said first switching means.

8. The combination as claimed in claim 7 wherein said first and second switching means each include a transistor having a base, a collector and an emitter; wherein each base is a control electrode, and wherein a collector and an emitter of a transistor define the ends of a conduction path; and wherein said load is connected to the collector of the transistor of said first switching means.

9. The combination as claimed in claim 8 wherein the transistor of one of said first and second switching means is of one conductivity type; and wherein the transistor of the other one of said first and second switching means is of opposite conductivity type.

10. The combination as claimed in claim 8 wherein the means connected between the input terminal and the control electrode of the first switching means includes a resistor and wherein the means connected between the input terminal and the control electrode of the second switch means includes a second, coupling, capacitor.

11. The combination as claimed in claim 7 wherein said first switching means is a regenerative switch.

12. The combination as claimed in claim 7 wherein said second switching means is a regenerative switch.

13. The combination as claimed in claim 7 wherein said load is a resistive load connected at one end to said one end of the conduction path of said first switching means; and further including a source of operating potential connected between the other end of said resistive load and the other end of the conduction path of said first switching means.

14. The combination as claimed in claim 7 wherein said means connecting the conduction path of said second switching means to the other end of said capacitor includes an inductor.

15. The combination as claimed in claim 7 further including an unidirectional conducting element connected between the other end of said capacitor and the other end of the conduction path of said first switching means; said unidirectional conducting element being poled in a direction to establish a potential at said other end of said capacitor which is approximately equal to the potential present at the other end of the conduction path of said first switching means; and further including an unidirectional conducting element connected between the control electrode and the other end of the conduction path of said first switching means for limiting the reverse bias potential between the control electrode and the other end of the conduction path of said first switching means.

16. The combination as claimed in claim 15 wherein said unidirectional elements are diodes.

17. The combination comprising:

first and second switching means; each switching means having a conduction path and a control electrode for controlling the conductivity of its conduction path;

means for connecting a load to one end of the conduction path of said first switching means;

means for storing signal having at least first and second terminals means connecting said first terminal to said one end of the conduction path of the first switching means;

means connecting the conduction path of said second switching means between said second terminal and the control electrode of said first switching means;

an input point for the application thereto of input signals; and means connected between said input point and the control electrodes of said first and second switching means responsive to the presence of an input signal for turning on said first switching means and maintaining said second switching means in the off condition and responsive to the termination of said input signal for applying the stored signal to the control electrode of said first switching means through a low impedance connection for turning off said first switching means rapidly.

18. The combination as claimed in claim 17, wherein said means for storing signal includes a capacitor for level shifting the signal coupled to, and stored at, said second terminal.

* * * * *